(12) United States Patent
Khan

(10) Patent No.: US 6,483,388 B2
(45) Date of Patent: Nov. 19, 2002

(54) DIRECT DIGITAL FREQUENCY SYNTHESIZER AND A HYBRID FREQUENCY SYNTHESIZER COMBINING A DIRECT DIGITAL FREQUENCY SYNTHESIZER AND A PHASE LOCKED LOOP

(75) Inventor: Nasserullah Khan, Waterloo (CA)

(73) Assignee: Research In Motion Limited, Waterloo (CA)

( * ) Notice: Subject to any disclaimer, the term of this patent is extended or adjusted under 35 U.S.C. 154(b) by 0 days.

(21) Appl. No.: 09/867,829

(22) Filed: May 30, 2001

(65) Prior Publication Data

US 2002/0008588 A1 Jan. 24, 2002

Related U.S. Application Data

(60) Provisional application No. 60/212,999, filed on Jun. 21, 2000.

(51) Int. Cl.⁷ ................................................. H03L 7/00
(52) U.S. Cl. ........................... 331/18; 331/25; 327/105; 327/106
(58) Field of Search ................................. 327/105, 106; 708/271; 331/18, 25, 2; 455/118, 260, 265, 264

(56) References Cited

U.S. PATENT DOCUMENTS

| | | | | |
|---|---|---|---|---|
| 4,636,748 A | * | 1/1987 | Latham, II | 331/111 |
| 5,160,900 A | * | 11/1992 | Visuri | 331/14 |
| 5,184,093 A | * | 2/1993 | Itoh et al. | 327/107 |
| 5,736,950 A | * | 4/1998 | Harris et al. | 341/143 |
| 5,801,589 A | * | 9/1998 | Tajima et al. | 331/1 R |
| 6,226,509 B1 | * | 5/2001 | Mole et al. | 455/302 |
| 6,347,325 B1 | * | 2/2002 | Ribner et al. | 708/271 |
| 2002/0055337 A1 | * | 3/2001 | Persico et al. | 455/112 |

* cited by examiner

Primary Examiner—Robert Pascal
Assistant Examiner—Kimberly E Glenn
(74) Attorney, Agent, or Firm—Jones, Day, Reavis & Pogue; Krishna K. Pathiyal, Esq.; Charles B. Meyer, Esq.

(57) ABSTRACT

A direct digital frequency synthesizer and a hybrid frequency synthesizer combining the direct digital frequency synthesizer and a phase locked loop is provided. The direct digital frequency synthesizer includes a phase accumulator that is configured to generate a discrete phase signal. Spurious phase modulation in the discrete phase signal is reduced by a noise shaper, and the output of the noise shaper is then used to address a phase-to-amplitude translator. The phase-to-amplitude translator generates a discrete waveform which is converted to a continuous waveform by a digital to analog converter. The hybrid frequency synthesizer uses a mixer to combine a reference frequency generated by a reference source and a DDFS output signal generated by a direct digital frequency synthesizer. The output from the mixer is then coupled to the input of a phase locked loop which multiplies the mixer output to generate the frequency synthesizer output.

68 Claims, 9 Drawing Sheets

DIRECT DIGITAL FREQUENCY SYNTHESIZER AND A HYBRID FREQUENCY SYNTHESIZER COMBINING A DIRECT DIGITAL FREQUENCY SYNTHESIZER AND A PHASE LOCKED LOOP

CROSS-REFERENCE TO RELATED APPLICATION

This application claims priority from and is related to the following prior application: Direct Digital Frequency Synthesizer And A Hybrid Frequency Synthesizer Combining A Direct Digital Frequency Synthesizer And A Phase Locked Loop, U.S. Provisional Patent Application No. 60/212,999, filed Jun. 21, 2000. This prior application, including the entire written description and drawing figures, is hereby incorporated into the present application by reference.

BACKGROUND

1. Field of the Invention

This application relates generally to frequency synthesizers. More specifically, the application describes a novel direct digital frequency synthesizer (DDFS), and a hybrid frequency synthesizer combining a novel DDFS and a phase locked loop (PLL).

2. Description of the Related Art

The frequency synthesizer is an important element of a wireless device. It controls the frequency of transmission and reception, and should, therefore, generate an output signal with an accurate frequency which has low spurious levels, low phase noise, and good frequency resolution. In addition, the compact nature of modem mobile devices creates a need for frequency synthesizers which have low power consumption, require few external components, and occupy very little space.

In many mobile devices, frequency synthesizers are also used to modulate the transmission signal. With a rising demand for systems capable of complex modulation schemes such as Quadrature Amplitude Modulation (QAM) or Quaternary Phase Shift Keying (QPSK), there is a need for frequency synthesizers which have very high switching speeds and which are capable of performing complex modulations and compressing high data rates into a narrow RF spectrum.

Two circuits commonly used for frequency synthesis are the phase locked loop frequency synthesizer (PLL) and the direct digital frequency synthesizer (DDFS). FIG. 1 sets forth a block diagram of a known phase locked loop frequency synthesizer. In this circuit, the free running frequency of the voltage controlled oscillator (VCO) 18 is divided by a factor of N in a divider 20, and compared with a reference input frequency (Fref) by a phase detector 12. The phase detector 12 generates an error signal which controls the direction of a current pulse generated by a charge pump 14 based on the phase difference between Fref and the feedback signal. A loop filter 16 then converts the current pulse from the charge pump 14 into a DC voltage which controls the frequency of the VCO output. When the loop is locked, Fout is equal to N*Fref.

Although the PLL shown in FIG. 1 is useful for generating high frequencies locked to a reference frequency, its use in high performance mobile devices is limited because of its slow switching speed, relatively large step size (equal to Fref) and spurious output. In addition, because the PLL has a fixed input (Fref), its output signal frequency can only be changed by changing the division ratio N. This feature limits the utility of such PLLs in mobile systems having complex modulation schemes.

FIG. 2 shows a block diagram of a known direct digital frequency synthesizer (DDFS). In this circuit, a reference frequency (Fref) is used by a phase accumulator 24 to generate a discrete phase signal having phase increments controlled by a frequency control word (FCW) input to the phase accumulator 24. Since the phase accumulator 24 has fixed output word length, the accumulated phase value will eventually overflow, such that the discrete phase signal is a substantially periodic signal having a period T as shown in FIG. 2. The discrete phase signal is then used to address a sine lookup ROM 26, which generates a discrete waveform having a frequency equal to the inverse of the discrete phase signal period (1/T). The discrete waveform is converted to a continuous waveform by a digital to analog converter (DAC) 28, and is smoothed by a deglitcher 30 and low pass filter 32.

This known DDFS 22 has a high switching speed and can be used for accurate modulation. Its utility in high performance systems is limited, however, due to its spurious output and large power consumption at high frequencies. The spurious output associated with DDFS 22 is caused by the non-linear nature of the DAC 28, and the finite word length effects in the sine lookup ROM 26 and DAC 28. The location and level of these spurious signals have been analyzed in "An analysis of the output Spectrum of Direct Digital Frequency Synthesizers in the presence of Phase Accumulator Truncation," Henry T. Nicholas, and Henry Samueli, $41^{st}$ *Annual Frequency Control Symposium*, 1987, "The Optimization of Direct Digital Frequency Synthesizer Performance in the presence of Finite Word Length Effects," Henry T. Nicholas, Henry Samueli, and Bruce Kin, $42^{nd}$ *Annual Frequency Control Symposium*, 1988, pp 357–363, and "An Exact Spectral Analysis of a Number Controlled Oscillator Based Synthesizer," Joseph F. Garvey, Daniel Babitch, $44^{th}$ *Annual Frequency Control Symposium*, 1990, pp 511–521. It has been shown that the dominant component of the spurious content is due to the phase errors introduced by phase truncation at the output of the phase accumulator 24.

In addition, the maximum frequency that can be directly generated from the DDFS 22 shown in FIG. 2 is equal to one half the reference frequency (Fref/2). Practically, only 30% of Fref can be generated. Consequently, in a system requiring frequencies on the order of tens or hundreds of MHz, the reference frequency must be very high. The power consumption necessary to generate the required reference frequency makes it difficult to integrate this known DDFS 22 into most next generation mobile devices.

FIG. 3 shows a block diagram of a known hybrid frequency synthesizer 34. This hybrid circuit 34 combines the DDFS 22 shown in FIG. 2 with the PLL 10 shown in FIG. 1. The PLL 10 in this circuit uses the lower frequency output of the DDFS 22 as its reference frequency, and converts it into a higher frequency output signal suitable for use in mobile devices. This hybrid combination 34 resolves some of the problems associated with the synthesizers shown in FIG. 1 and FIG. 2. Nonetheless, this known hybrid 34 is unsuitable for many high performance mobile applications because of its large power consumption and spurious output. In order to increase the output of the DDFS 22 to a frequency in the RF range, the PLL 10 must have a large division ratio N. The cost of a large division ratio N is that the spurious signals generated by the DDFS 22 are exponentially increased in strength by the PLL 10 and passed through to the frequency synthesizer output. Moreover, the DDFS 22 cannot generate an output with acceptably low spurious signals without utilizing a very high reference frequency on the order of hundreds of MHz. This requires an unacceptable trade-off between power consumption and signal integrity.

Briefly stated, the relatively high power consumption and output noise associated with known frequency synthesis techniques limit their application in power and noise sensitive environments, such as mobile communications systems. Moreover, most current research in frequency synthesizer design is focused on obtaining higher frequencies, close to 1 GHz, directly from a DDFS. Unfortunately, circuits of this type require clock frequencies of 2 GHz and higher, and, therefore, exhibit power consumption on the order of Watts. This direct synthesis approach is not feasible in portable wireless applications where battery life and power consumption are critical parameters.

SUMMARY

A direct digital frequency synthesizer and a hybrid frequency synthesizer combining the direct digital frequency synthesizer and a phase locked loop is provided. The direct digital frequency synthesizer includes a phase accumulator that is configured to generate a discrete phase signal. Spurious phase modulation in the discrete phase signal is reduced by a noise shaper, and the output of the noise shaper is then used to address a phase-to-amplitude translator. The phase-to-amplitude translator generates a discrete waveform which is converted to a continuous waveform by a digital to analog converter. The hybrid frequency synthesizer uses a mixer to combine a reference frequency generated by a reference source and a DDFS output signal generated by a direct digital frequency synthesizer. The output from the mixer is then coupled to the input of a phase locked loop which multiplies the mixer output to generate the frequency synthesizer output.

DETAILED DESCRIPTION

Figure 4:
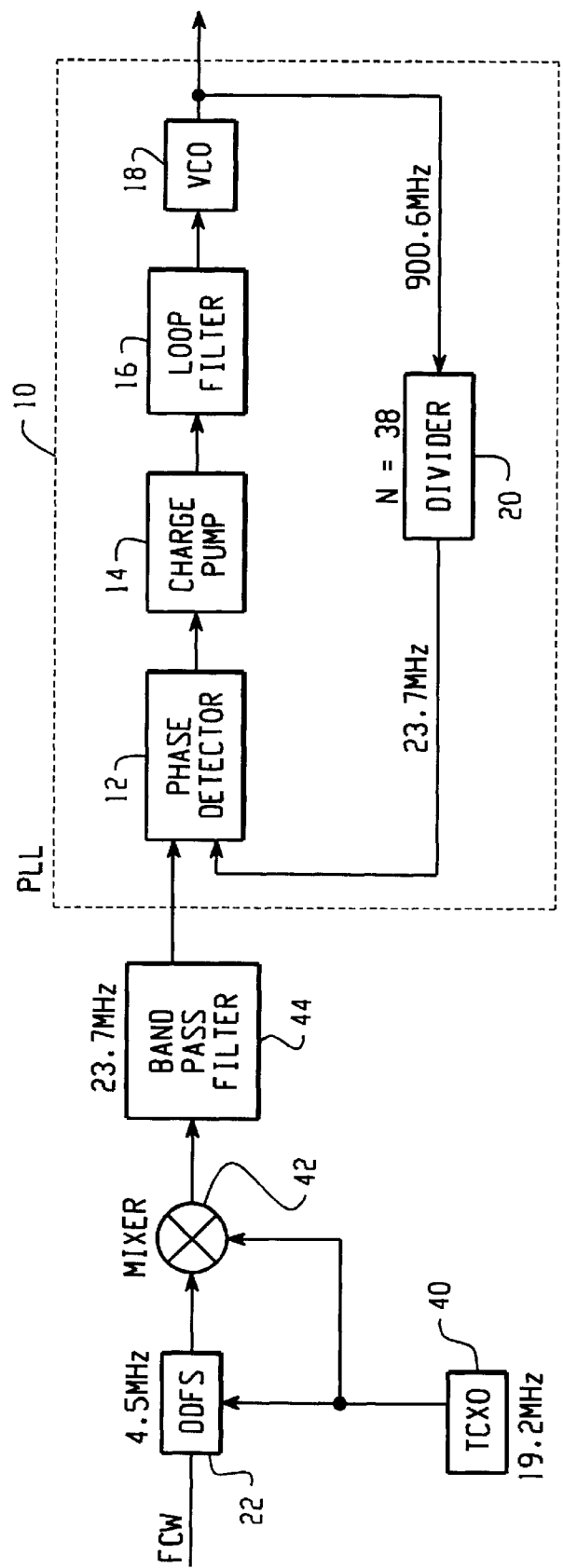
FIG. 4 is a block diagram of an exemplary hybrid frequency synthesizer according to the present invention.

Turning now to the drawing figures, FIG. 4 is a block diagram of an exemplary hybrid frequency synthesizer 38 according to the present invention. This circuit 38 includes a direct digital frequency synthesizer (DDFS) 22, a temperature controlled crystal oscillator (TCXO) 40, a mixer 42, a band pass filter 44, and a phase locked loop frequency synthesizer (PLL) 10. The PLL 10 includes a phase detector 12, a charge pump 14, a loop filter 16, a voltage controlled oscillator (VCO) 18, and a divider 20. Operationally, this circuit uses the mixer 42 to sum the output frequencies of the DDFS 22 and TCXO 40, and uses the higher frequency mixer output signal as the input to the PLL 10. It should be understood that the specific numerical values shown are given as an example only.

Figure 2:
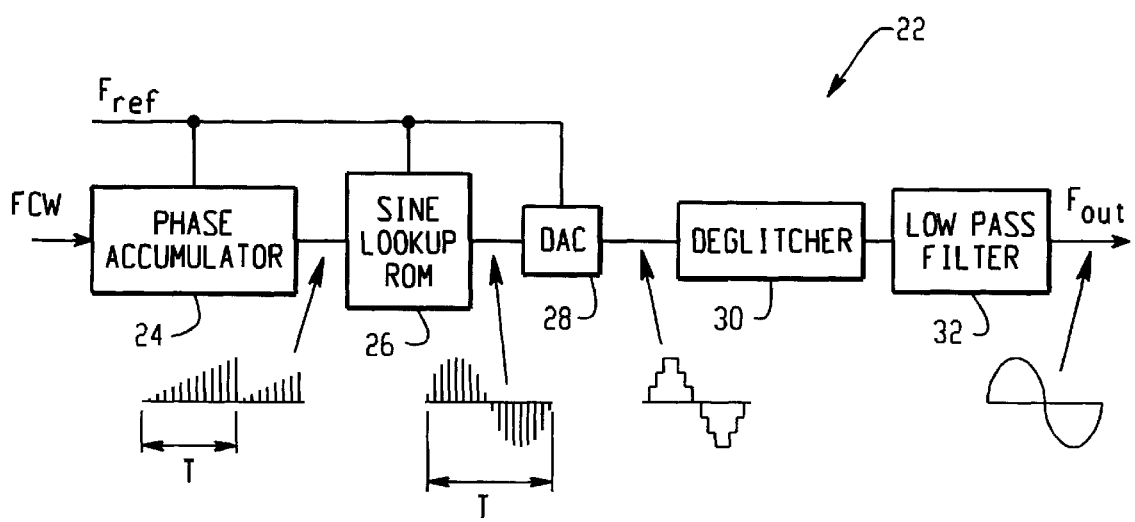
FIG. 2 is a block diagram of a known direct digital frequency synthesizer.
Figure 3:
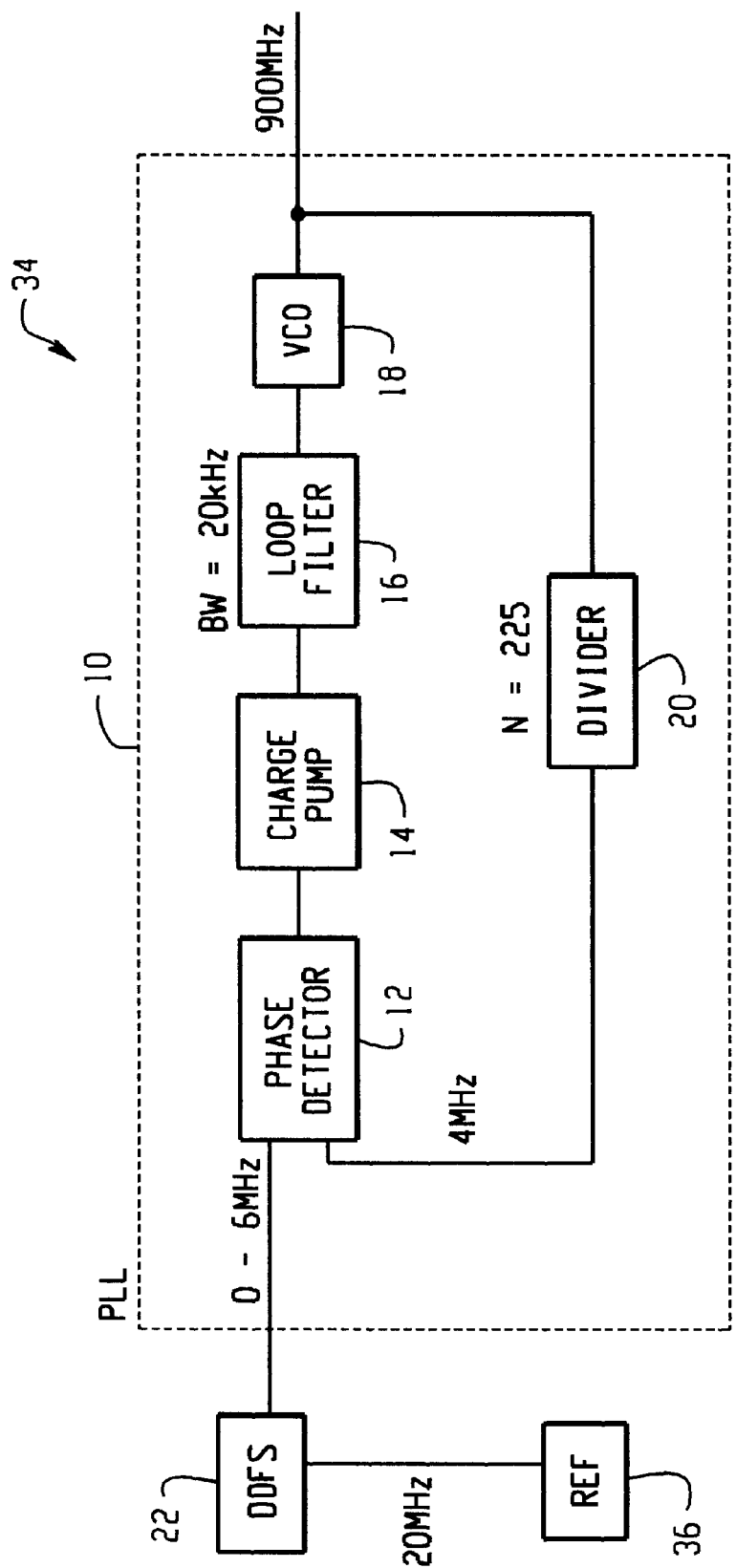
FIG. 3 is a block diagram of a known hybrid frequency synthesizer.

The DDFS 22 receives a clock input (also called a reference frequency signal) from the TCXO 40 and a frequency control word input (FCW), and generates a DDFS output signal. The DDFS 22 may be any known DDFS, including the known DDFS 22 shown in FIG. 2. The frequency of the DDFS output signal (4.5 MHz) is increased by the mixer 42, which combines it with the reference frequency signal (19.2 MHz) to generate a mixer output signal (23.7 MHz). The mixer output signal is smoothed by the band pass filter 44 and coupled to the PLL 10. The PLL 10 then multiplies the signal by a division ratio N and locks it in phase.

Figure 1:
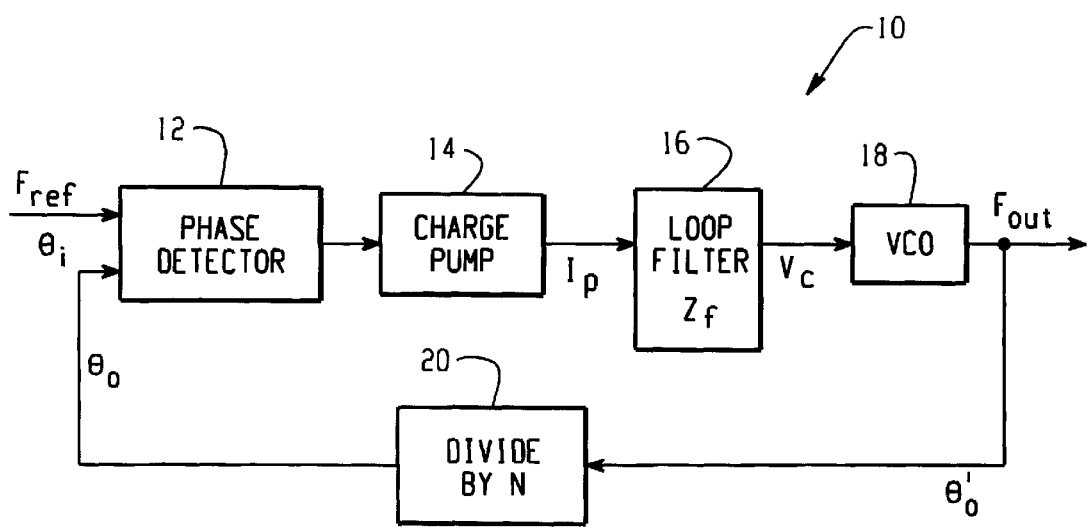
FIG. 1 is a block diagram of a known phase locked loop frequency synthesizer.

The PLL 10 can be any known phase locked loop synthesizer having the necessary division ratio N, including the PLL 10 shown in FIG. 1. In this exemplary embodiment, the PLL 10 includes the voltage controlled oscillator (VCO) 18, which generates the frequency synthesizer output. The frequency synthesizer output is divided by a factor of N in divider 20, and fed back to the phase detector 12. The phase detector 12 compares this feedback signal with the smoothed mixer output signal from the band pass filter 44, and generates an error signal. The error signal then controls the direction of a current pulse generated by the charge pump 14 based on the phase difference between the feedback signal and the smoothed mixer output signal. The loop filter 16 converts the current pulse from the charge pump 14 into a DC voltage which controls the frequency of the VCO 18.

The use of the mixer 42 in this exemplary embodiment 38 to boost the frequency of the DDFS output signal, makes it possible to utilize a PLL 10 having a reduced division ratio N. Depending on the data network (e.g., Mobitex, Datatac, CDPD), division ratios can be in the range of about 32 to about 39. The reduction in the value of N to 38 in this embodiment makes it possible to utilize a hybrid frequency synthesizer structure to generate frequencies in the RF range without generating high dB level spurious signals in the frequency synthesizer output which are incompatible with mobile applications.

Figure 5:
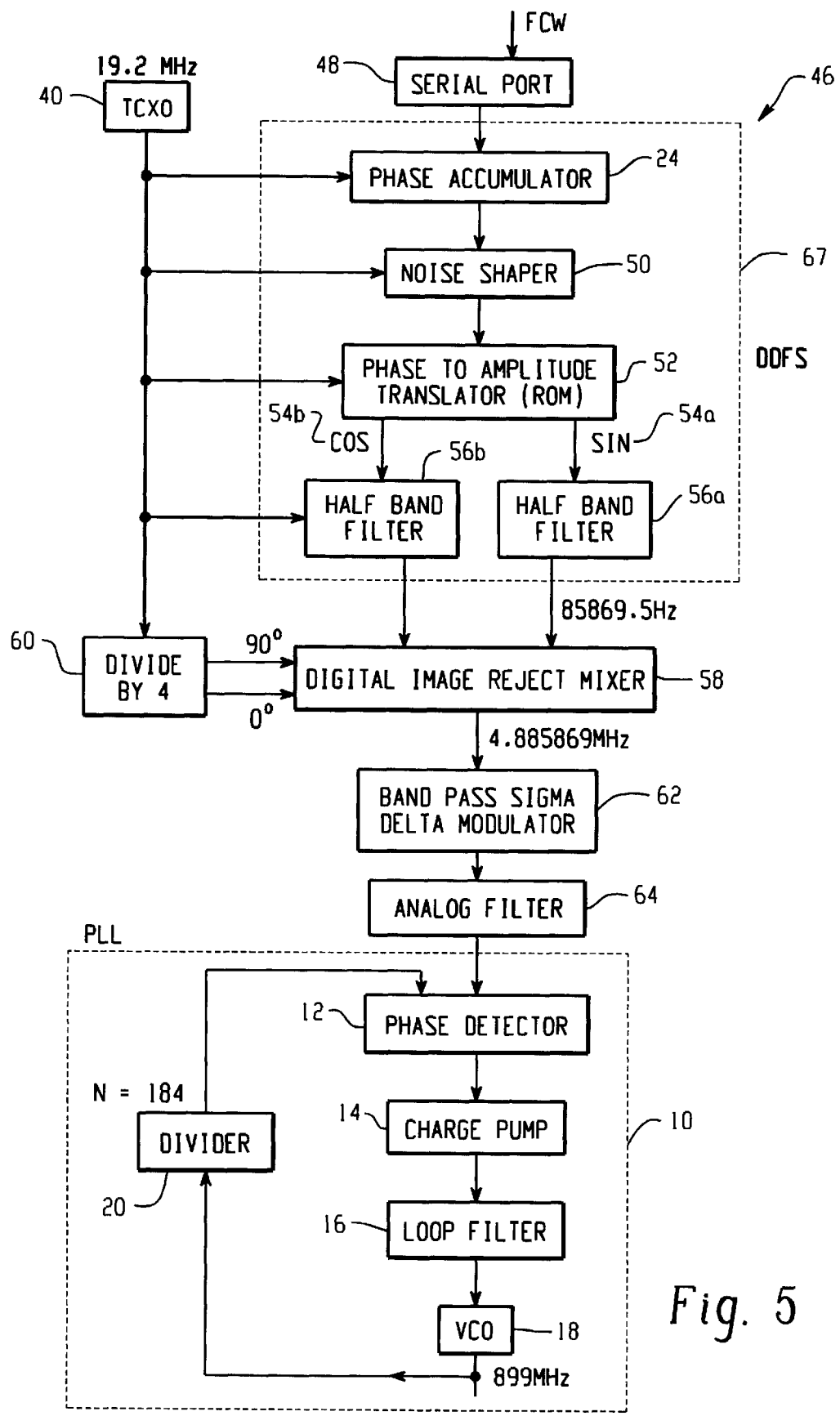
FIG. 5 is a block diagram of an exemplary embodiment of a hybrid frequency synthesizer including an improved direct digital frequency synthesizer and a digital image reject mixer according to the present invention.

FIG. 5 is a block diagram of an exemplary embodiment of a hybrid frequency synthesizer including an improved direct digital frequency synthesizer and a digital image reject mixer according to the present invention. The circuit 46 shown in FIG. 5 includes a serial port 48, a TCXO 40, an improved DDFS 67, a digital image reject mixer 58, a divide by four divider 60, a band pass sigma delta modulator 62, an analog filter 64, and a PLL 10. The improved DDFS 67 includes a phase accumulator 24, a noise shaper 50, a phase-to-amplitude translator 52, and a first and second half-band filter 56a and 56b. The PLL 10 includes a phase detector 12, a charge pump 14, a loop filter 16, a VCO 18, and a divider 20. It should be understood, however, that the specific numerical values shown are given as examples only.

The output frequency of this circuit 46 is tuned using a frequency control word input (FCW), which is coupled to the accumulator 24 of the DDFS through a serial port 48. The accumulator receives the FCW and a reference frequency signal (Fref) from the TCXO 40, and generates a discrete phase signal having phase increments, and thus a period T, controlled by the FCW. The discrete phase signal is coupled to a noise shaper 50, which reduces the spurious phase modulation (noise) at the desired output frequency. The noise shaper 50 can be any known noise shaper employing first order sigma delta modulation or higher. The discrete noise shaper output is then used to address the phase-to-amplitude translator (ROM) 52, which generates a discrete sine waveform 54a and a discrete cosine waveform 54b, each having a frequency substantially equal to the inverse of the period of the discrete phase signal (1/T).

The discrete sine and cosine waveforms 54a and 54b generated by the phase-to-amplitude translator 52 are filtered by half-band filters 56a and 56b, and are coupled to the digital image reject mixer 58. Each of the half-band filters 56a and 56b can be any known half-band filter capable of reducing noise at $$\frac{F_{ref}}{2},$$

which is effectively folded back over the desired discrete sine and cosine waveforms 54a and 54b as a result of the multiplication function performed by the digital image reject mixer 58.

The divide by four divider 60 divides the reference frequency signal (Fref) in order to generate a 0° phased clock pulse and a 90° phased clock pulse, each having a frequency substantially equal to $$\frac{F_{ref}}{4}.$$

The digital image reject mixer 58 receives the discrete sine and cosine waveforms 54a and 54b and the 0° and 90° phased clock pulses, and generates a mixer output signal having a frequency substantially equal to $$\frac{F_{ref}}{4} + \frac{1}{T}.$$

In one embodiment, the most significant bit from the mixer output is coupled to the PLL 10 (not shown in drawings). The PLL then multiplies the frequency of the mixer output by the division ratio N and locks it in phase as described above with respect to FIG. 4. If greater precision is desired, however, the entire range of the mixer output may be utilized by coupling a band pass sigma delta modulator 62 between the image reject mixer 58 and the PLL 10. The band pass sigma delta modulator 62 converts the sixteen (16) bit mixer output into a modulated one bit signal where the average pulse rate at any time is equal to the amplitude of the desired sine waveform. An analog filter 64 may also be coupled between the band pass sigma delta modulator 62 and the PLL 10 in order to remove unwanted spurious signals.

The exemplary embodiment of a hybrid frequency synthesizer shown in FIG. 5 provides a number of improvements over known hybrid frequency synthesizers. Significantly, this embodiment can generate an RF output with very high spectral purity while consuming a relatively small amount of power. These features make this embodiment especially useful in high performance mobile devices.

Figure 6:
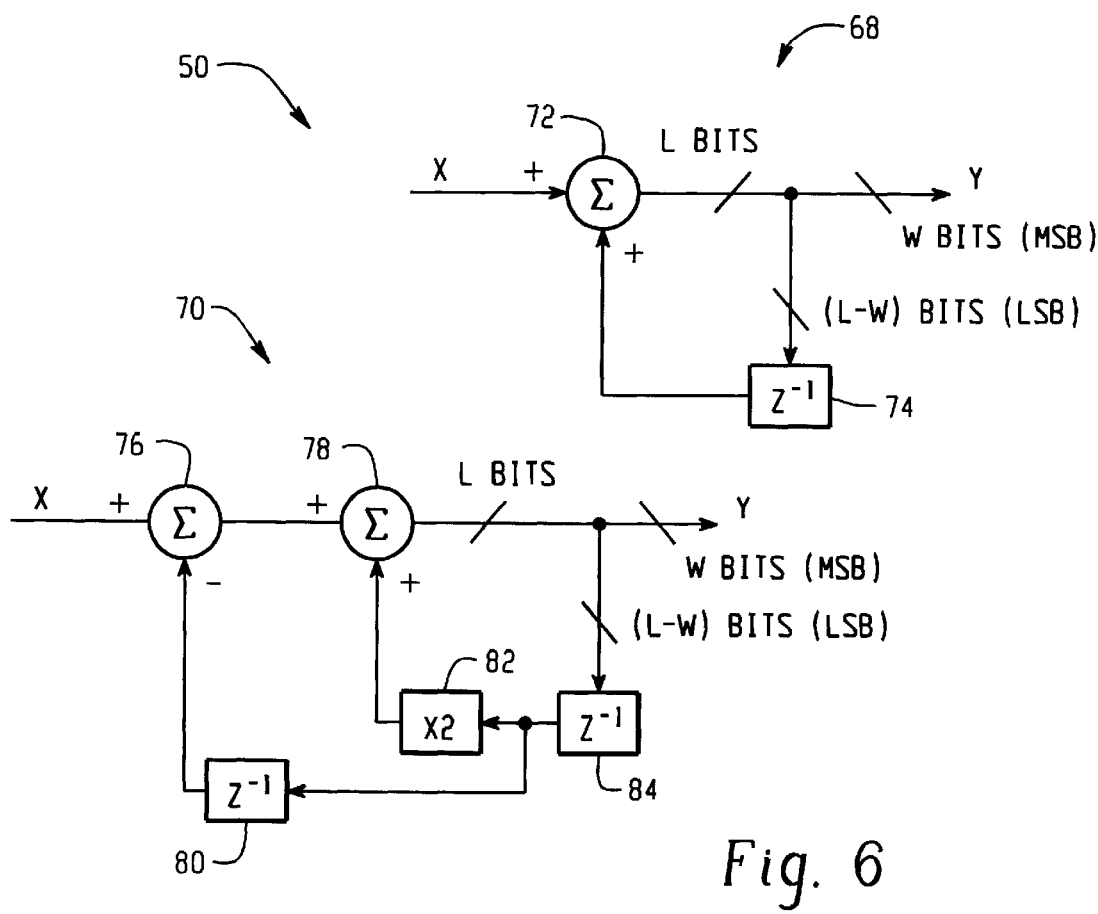
FIG. 6 sets forth block diagrams of an exemplary first order noise shaper and an exemplary second order noise shaper.

FIG. 6 sets forth block diagrams for exemplary first and second order noise shapers 68 and 70, either of which can be used for the noise shaper 50 in FIG. 5. The first order noise shaper 68 includes an adder 72 and a delay 74. The second order noise shaper 70 includes a first adder 76, a second adder 78, a first delay 80, a second delay 84, and a bit shift 82. Operationally, these noise shapers reduce spurious phase modulation close to the carrier by using known sigma delta techniques as described in "A Direct Digital Synthesizer with Improved Spectral Performance," Paul O'Leary and Franco Maloberti, *IEEE Transactions on Communications* Vol. 39, No.7, July 1991, and "Delta Sigma Data Converters, Theory, Design and Simulation," edited by Steven R. Norsworthy, Richard Schreier, and Gabor C. Temes, *IEEE Press*. 1997. Simply stated, the noise shapers 68 and 70 push noise away from the desired output frequency to higher and lower frequencies which are filtered out by the PLL 10.

Figure 7:
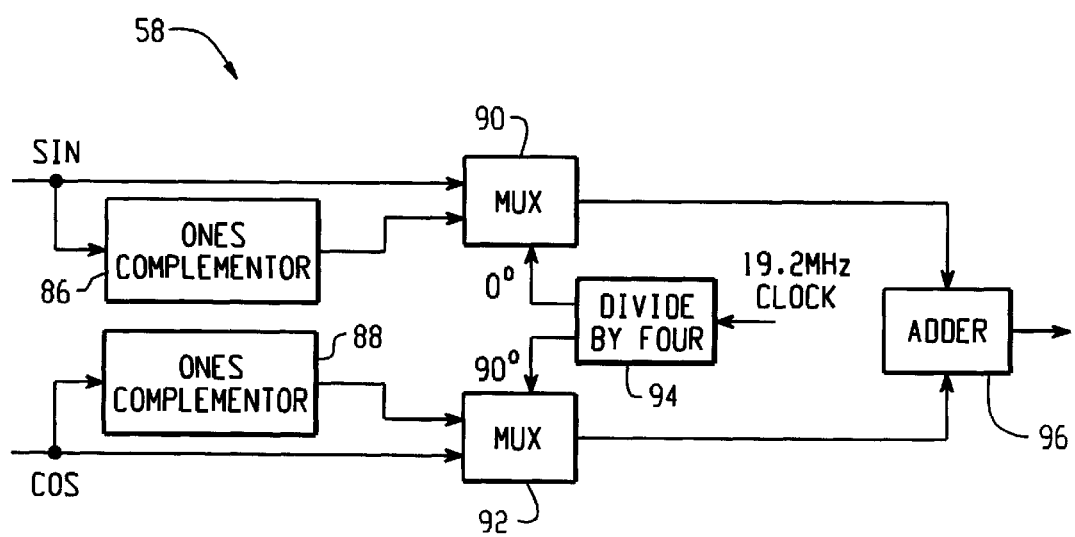
FIG. 7 is a block diagram of an exemplary digital image reject mixer.

FIG. 7 shows a block diagram of an exemplary digital image reject mixer 58. This circuit includes a first ones complementor 86, a first multiplexer (MUX) 90, a second ones complementor 88, a second multiplexer (MUX) 92, a divide by four divider 94, and an adder 96. The first and second ones complementors 86 and 88 generate at their respective outputs the ones complements of their inputs. Those skilled in the art will appreciate that the complementors may be a bank of inverters, for example one inverter for each input bit. The state of the 0° phased clock pulse controls whether the multiplexer 90 selects the discrete sine waveform 54 or its complement (generated by the first ones complementor 86). This causes the sine signal to be multiplied by the 0° phased clock/4 signal. Similarly, the second multiplexer 92 multiplies the cosine signal with the 90° phased clock/4 signal derived from the divide by four divider 94. The outputs of the first and second multiplexers 90 and 92 are then summed in adder 96 in order to eliminate the image frequency.

One advantageous function of the digital image reject mixer 58 is the reduction of spurious signals close to the carrier. An analog mixer may cause inter-modulation of the DDFS output signal and the reference frequency signal. In a digital image reject mixer 58, however, the image frequency is eliminated, leaving only the wanted frequency at the output of the adder 96.

Figure 8:
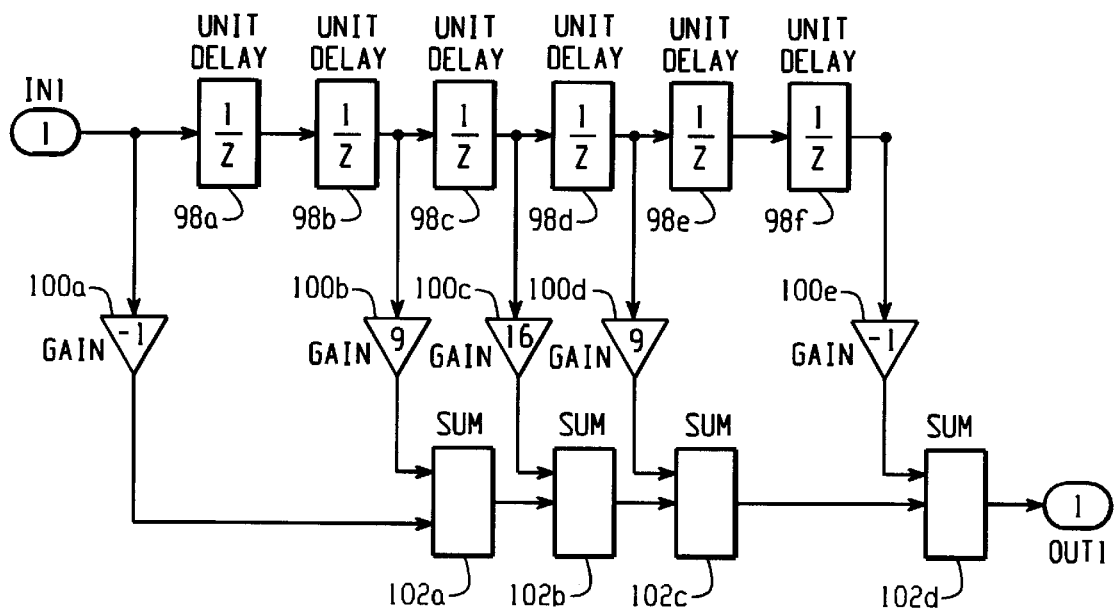
FIG. 8 is a block diagram of an exemplary half-band filter.

FIG. 8 shows a block diagram of half-band filters 56a and 56b. This circuit includes six delays 98a–98f, five multipliers 100a–100e, and four summation blocks 102a–102d, configured to filter noise at one half the reference frequency $$\left(\frac{F_{ref}}{2}\right).$$

It should be understood, however, that FIG. 8 shows only one of numerous half-band filters which may be designed for use in direct digital frequency synthesizers such as those shown in this application, using known techniques as described in *Multirate Digital Signal Processing*, Ronald E. Crochier and Lawrence R. Rabiner, Prentice-Hall Inc., 1983.

Figure 9:
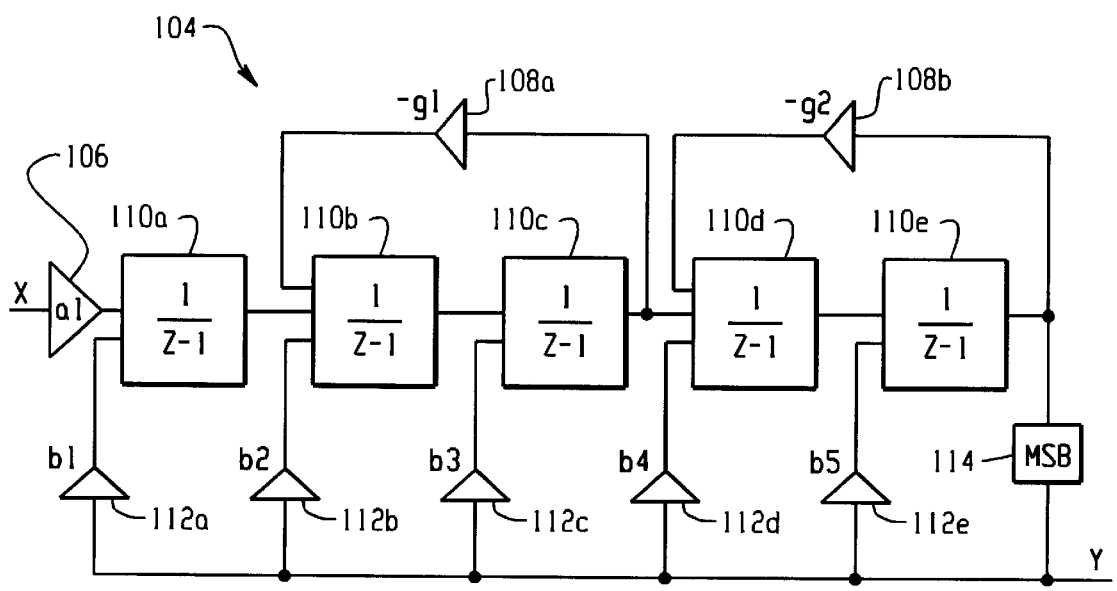
FIG. 9 is a block diagram of an exemplary fifth order sigma delta modulator.
Figure 10:
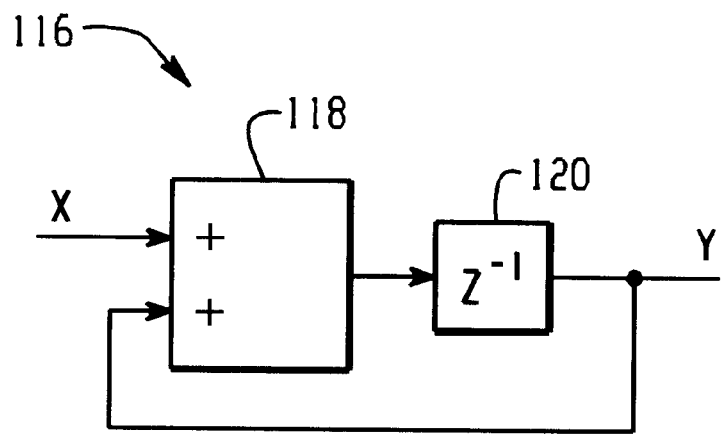
FIG. 10 is a block diagram showing a more detailed representation of the integrator blocks shown in FIG. 9.
Figure 11:
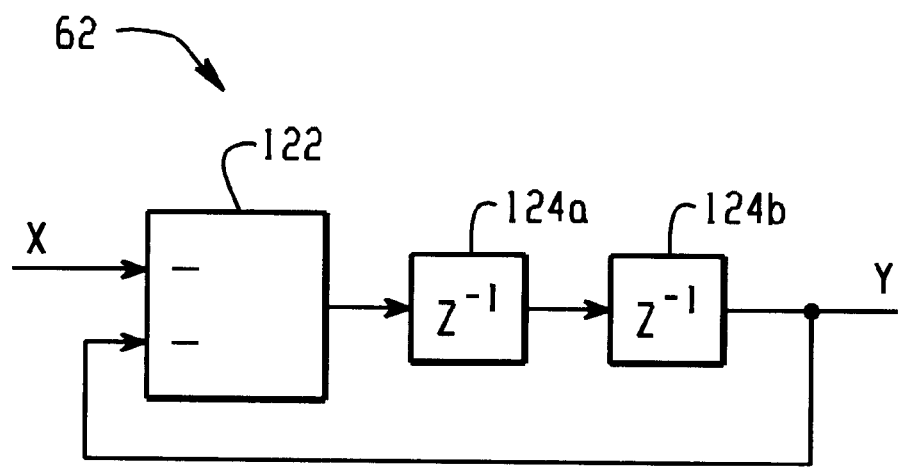
FIG. 11 is a block diagram of an exemplary integrator for transforming the fifth order sigma delta modulator shown in FIG. 9 into a band pass sigma delta modulator.

FIGS. 9 through 11 show an exemplary method of constructing a band pass sigma delta modulator 62 as set forth in "Delta Sigma Data Converters, Theory, Design and Simulation," edited by Steven R. Norsworthy, Richard Schreier and Gabor C. Temes, *IEEE Press,* 1997. Briefly stated, an exemplary band pass sigma delta modulator 62 may be constructed by first designing a less complex low pass modulator 104 as shown in FIG. 9. Then, using the transform $z=-z^2$, a band pass sigma delta modulator 62 can be achieved that preserves the stability and the noise transfer function (NTF) shape of the low pass modulator.

FIG. 9 shows a block diagram of an exemplary fifth order sigma delta modulator 104 (low pass modulator), comprising five integrators 110a–110e, and seven multipliers, 106, 108a, 108b, and 112a–112e. FIG. 10 is a block diagram showing a more detailed representation of the integrator blocks 110a–110e shown in FIG. 9. Each integrator 110a–110e in the low pass modulator 104 includes a delay 120 looped back through a summation block 118. In order to transform the low pass modulator 104 into a band pass sigma delta modulator 62, each integrator block 110a–110e is replaced with the circuit shown in FIG. 11. FIG. 11 includes a negative summation block 122 and two delays 124a and 124b, and implements the transfer function $$\frac{1}{-z^2-1}.$$

Figure 12:
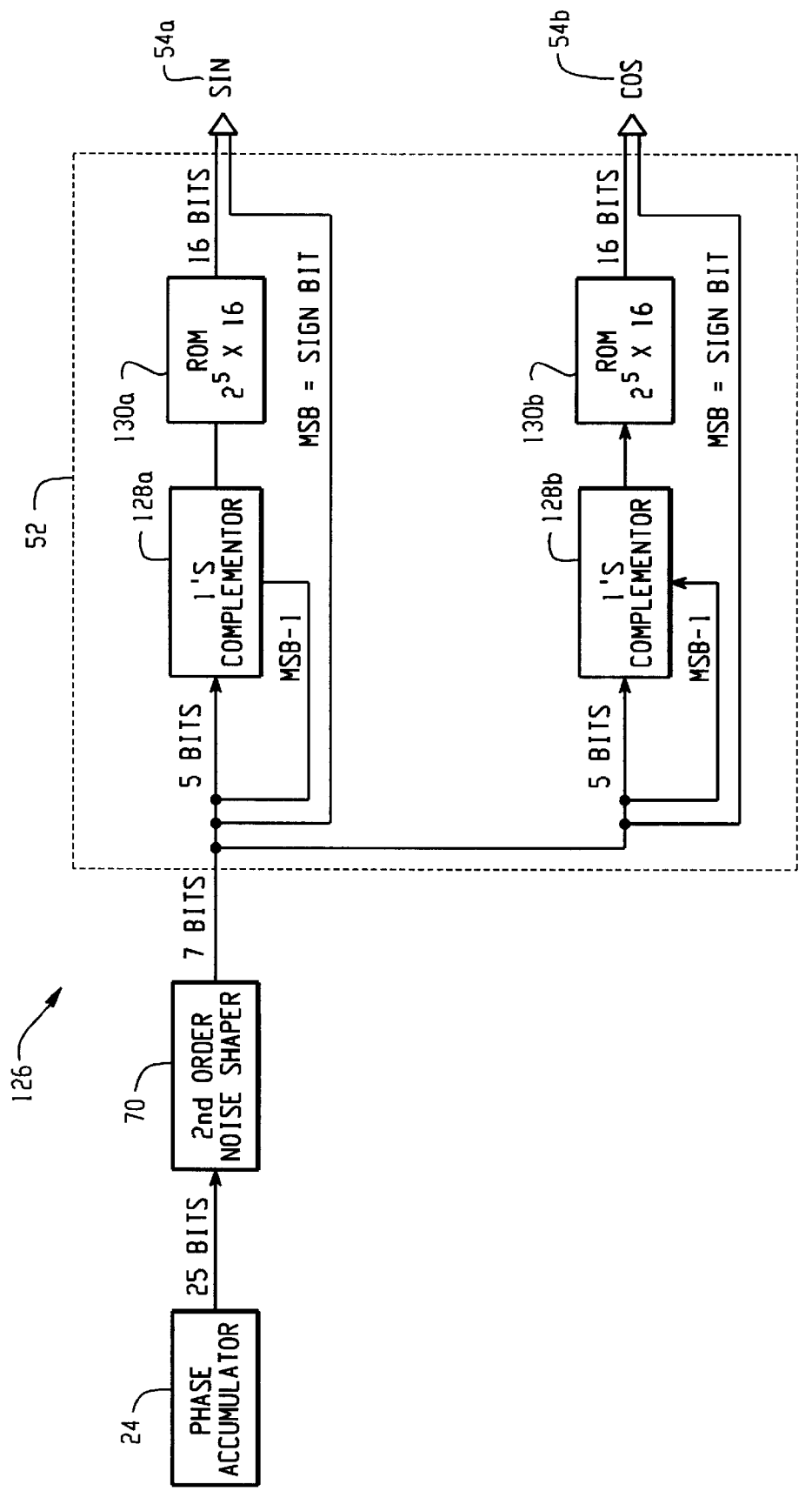
FIG. 12 is a block diagram of an exemplary direct digital frequency synthesizer implementing $2^5 \times 16$ bit ROMs for use with hybrid frequency synthesizers as shown in FIG. 5.

FIG. 12 is a block diagram of an exemplary direct digital frequency synthesizer 126 implementing $2^5 \times 16$ bit ROMs 130a and 130b for use with hybrid frequency synthesizers as shown in FIG. 5. This circuit includes a phase accumulator 24, a second order noise shaper 70, a first ones complementor 128a, a first $2^5 \times 16$ bit ROM 130a, a second ones complementor 128b, and a second $2^5 \times 16$ bit ROM 130b. Each of the ones complementors 128a and 128b operates similarly to the ones complementor/MUX arrangements 86/90 and 88/92 in FIG. 7, to generate at its output either its input signal or the ones complement thereof The phase accumulator 24, as described above with respect to FIG. 5, generates a discrete phase signal, having 25 bits in the embodiment shown in FIG. 12. The second order noise shaper 70 reduces close in spurious signals and truncates the twenty-five (25) bit discrete phase signal, generating a discrete noise shaper output having seven (7) bits. It should be understood, however, that this embodiment 126 is not limited to a second order noise shaper 70, but can be implemented using any known noise shaper 50 employing first order sigma delta modulation or higher. The invention is similarly in no way limited to the specific numbers of bits for the signals shown in FIG. 12. The bit numbers are for illustrative purposes only. For example, the phase accumulator 24 need not necessarily have an output word length of 25 bits, a noise shaper may truncate the accumulator output to other than 7 bits, and the ROMs need not be restricted to $2^5 \times 16$ bit ROMs The first ones complementor 128a receives as its input the five (5) least significant bits from the discrete noise shaper output, and is controlled by the second most significant bit (MSB-1). The state of MSB-1 controls whether the first ones complementor output is equal to, or the complement of, its five (5) bit input.

The first $2^5 \times 16$ bit ROM 130a stores samples for only the first 90 degrees, i.e. the first quadrant, of a discrete sine waveform, which is addressed by the output of the first ones complementor 128a. Although only first quadrant amplitude samples are stored in the ROM 130a, a complete cycle of a sine waveform may be generated, as described in further detail below.

When the first ones complementor output is equal to its five (5) bit input, the ROM 130a generates a sixteen (16) bit output corresponding to the first quadrant of a sinewave. When the first ones complementor output is the complement of its five (5) bit input, the samples stored in the ROM 130a are addressed and output in an order corresponding to the second quadrant of a sinewave. The most significant bit (MSB) from the noise shaper output is then included as the sign bit of the 16 bit output from the ROM 130a. Therefore, when the MSB changes state, the 16 bit output of the ROM 130a becomes negative, producing a discrete signal corresponding to the third and fourth quadrants of a sinewave. When these operations are performed sequentially, a complete discrete sine waveform 54a is generated. Using a similar method, a discrete cosine waveform 54b is generated by the second ones complementor 128b, and the second $2^5 \times 16$ bit ROM 130b.

In a further embodiment, both the sine and cosine waveforms may be generated using a single ROM, which stores either sine or cosine amplitude samples for a single quadrant, in conjunction with appropriate addressing, ones complementor control and sign bit designation arrangements. Those skilled in the art will appreciate that a cosine waveform is merely a 90° shifted version of a sine waveform. Therefore, a discrete cosine waveform may be generated from stored sine waveform amplitude samples and vice versa.

If a ROM, such as ROM 130a in FIG. 12 for example, stores amplitude samples for the first quadrant of a sine waveform, then a complete sine waveform may be generated using a ones complementor (such as 128a), a complementor control bit and an output sign bit as described above. A cosine waveform may also be generated from the same ROM using a similar addressing, control bit and sign bit arrangement, but with the addition of an address offset component, such as an adder, to provide for the 90° phase shift. The address offset is preferably applied at an input to the phase-to-amplitude translator, i.e. to the 7-bit input to the "cosine" path in FIG. 12, to ensure that the complementor control bit and sign bit designations in FIG. 12 are the same for both the sine and cosine addressing arrangements. Similarly, sine amplitude samples could be generated from stored cosine samples.

It will be apparent to those skilled in the art that in single-ROM embodiments, the output from the ones complementor 128b would address the ROM 130a. Thus a phase-to-amplitude translator in accordance with this aspect of the invention eliminates the ROM 130b. Both the sine and cosine samples are generated from the ROM 130a. It should be understood, however, that the single-memory embodiment of the invention is not restricted to the ROM 130a shown in FIG. 12. Rather, the single ROM 130a could be replaced with any memory element capable of simultaneously receiving two address inputs and providing two outputs, such as a dual-ported memory element.

Similarly, provided that the addressing, ones complementor control and sign bit designation arrangements are suitably adapted, the memory element or elements may store sine or cosine amplitude samples for either of the four quadrants, not necessarily the first quadrant, or alternatively for any 90-degree portion of a sine or cosine waveform. The generation of complete sine and cosine waveform from such stored sine or cosine samples could then be accomplished substantially as described above.

In a conventional direct digital frequency synthesizer, such as DDFS 22, the ROM 26 consumes the greatest amount of power. Therefore, because the circuit shown in FIG. 12, as well as variations thereof, some of which have been described above, are realized using a smaller than conventional ROM which stores samples for only one quadrant, it is particularly well suited for wireless applications where power consumption may be an important factor.

Figure 13:
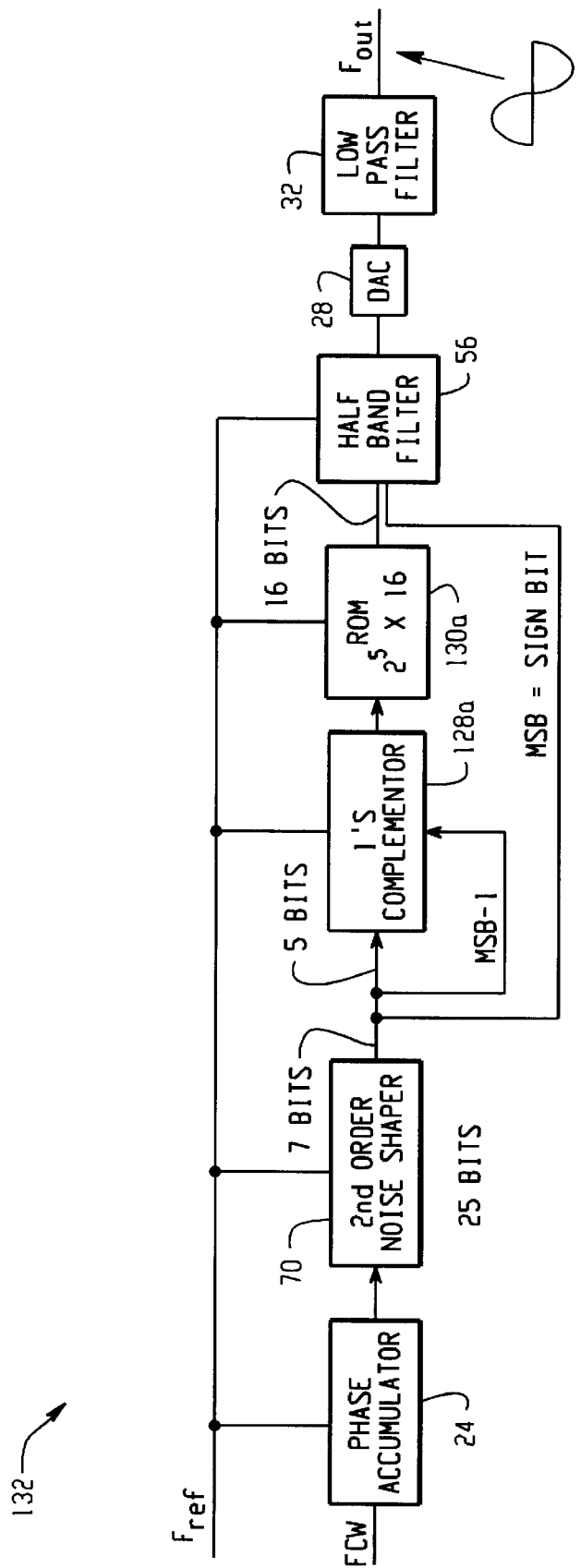
FIG. 13 is a block diagram of an exemplary direct digital frequency synthesizer.

FIG. 13 is a block diagram of an exemplary direct digital frequency synthesizer 131 which utilizes the DDFS 67, shown in FIG. 5 and FIG. 12, configured to function as a stand-alone digital frequency synthesizer. This circuit includes a phase accumulator 24, a second order noise shaper 70, a ones complementor 128a, a $2^5 \times 16$ ROM 130a, a half-band filter 56, a digital to analog converter 28, and a low pass filter 32.

The phase accumulator 24, noise shaper 50, ones complementor 128a, $2^5 \times 16$ ROM 130a, and half-band filter 56 operate substantially the same as described above with respect to the hybrid frequency synthesizer 46 shown in FIG. 5 and FIG. 12. Because this stand-alone circuit 131 does not utilize an image reject mixer 58, however, the discrete cosine waveform 54b and second half-band filter 56b are not needed. Instead, DAC 28 is included to convert the discrete output of the half-band filter 56 into a continuous waveform, which is then smoothed by low pass filter 32 to become the frequency generator output.

The invention has been described with reference to several preferred embodiments. Those skilled in the art will consider improvements, changes and modifications in view of the foregoing description. Such improvements, changes and modifications are intended to be within the scope of the claims.

I claim:

1. A hybrid frequency synthesizer, comprising:
   a reference source configured to generate a reference frequency signal;
   a direct digital frequency synthesizer (DDFS) configured to generate a DDFS output signal;
   a mixer coupled to the DDFS and the reference source, and configured to combine the reference frequency signal and the DDFS output signal to generate a mixer output signal; and
   a phase locked loop frequency synthesizer (PLL) coupled to the mixer, and configured to generate a frequency synthesizer output that is a multiple of the mixer output signal;
   wherein the DDFS comprises:
      a phase accumulator configured to generate a discrete phase signal;
      a sine lookup ROM addressed by the discrete phase signal that generates a discrete waveform;
      a digital to analog converter (DAC) coupled to the sine lookup ROM that converts the discrete waveform into a continuous waveform of substantially equal frequency;
      a low pass filter coupled to the DAC that smoothes the continuous waveform; and
      a deglitcher coupled between the DAC and the low pass filter that reduces spurious signals generated by the DAC.

2. The hybrid frequency synthesizer of claim 1, wherein the DDFS includes a frequency control word input that modulated the DDFS output signal.

3. The hybrid frequency synthesizer of claim 1, wherein the reference frequency signal is also a clock input to the DDFS.

4. The hybrid frequency synthesizer of claim 1, wherein the reference source is a crystal oscillator.

5. The hybrid frequency synthesizer of claim 4 wherein the crystal oscillator is a temperature controlled crystal oscillator.

6. The hybrid frequency synthesizer of claim 1, further comprising:
   a band pass filter coupled between the mixer and the PLL that reduces phase noise in the mixer output signal.

7. The hybrid frequency synthesizer of claim 1, wherein the PLL has a division ratio in the range of about 32 to about 39.

8. The hybrid frequency synthesizer of claim 1, wherein the PLL comprises:
   a feedback loop system including a divider;
   a phase detector configured to compare the mixer output signal and a feedback signal from the feedback loop system, and to generate an error signal as a function of a phase difference between the mixer output signal and the feedback signal;
   a charge pump coupled to the phase detector that generates a current pulse having a current direction which is determined by the error signal;
   a loop filter coupled to the charge pump that converts the current pulse into a DC voltage; and
   a voltage controlled oscillator coupled to the loop filter and the feedback loop system for generating the frequency synthesizer output as a function of the DC voltage.

9. A hybrid frequency synthesizer, comprising:
   a reference source configured to generate a reference frequency signal;
   a direct digital frequency synthesizer (DDFS) configured to generate a DDFS output signal;
   a mixer coupled to the DDFS and the reference source, and configured to combine the reference frequency signal and the DDFS output signal to generate a mixer output signal; and
   a phase locked loop frequency synthesizer (PLL) coupled to the mixer, and configured to generate a frequency synthesizer output that is a multiple of the mixer output signal;
   wherein the DDFS comprises:
      a phase accumulator configured to generate a discrete phase signal;
      a noise shaper that reduces spurious phase modulation in the discrete phase signal, and which generates a discrete noise shaper output; and
      a phase-to-amplitude translator addressed by the discrete noise shaper output for generating a discrete waveform that comprises the DDFS output signal, wherein the phase-to-amplitude translator comprises:
         a ones complementor coupled to the discrete noise shaper output, and configured to sequentially generate a pass-through output and an inverted output;
         a read only memory (ROM) coupled to the ones complementor and configured to generate a first quadrant of the discrete waveform when addressed by the pass-through output and a second quadrant of the discrete waveform when addressed by the inverted output; and
         means for inverting the first and second quadrants of the discrete waveform to generate a third and fourth quadrant of the discrete waveform.

10. The hybrid frequency synthesizer of claim 9, wherein the noise shaper is a first order noise shaper.

11. The hybrid frequency synthesizer of claim 9, wherein the noise shaper is a second order noise shaper.

12. The hybrid frequency synthesizer of claim 9, further comprising:

a half-band filter coupled to the phase-to-amplitude translator that reduces noise in the discrete waveform.

13. The hybrid frequency synthesizer of claim 9, wherein the phase-to-amplitude translator generates both a discrete sine waveform and a discrete cosine waveform that collectively comprise the DDFS output signal.

14. The hybrid frequency synthesizer of claim 13, further comprising:
a first half-band filter coupled to the phase-to-amplitude translator that reduces noise in the discrete sine waveform; and
a second half-band filter coupled to the phase-to-amplitude translator that reduces noise in the discrete cosine waveform.

15. The hybrid frequency synthesizer of claim 13, wherein the phase-to-amplitude translator comprises:
a first ones complementor coupled to the discrete noise shaper output, and configured to sequentially generate a first pass-through output and a first inverted output;
a first read only memory (ROM) coupled to the first ones complementor, and configured to generate a first quadrant of the discrete sine waveform when addressed by the first pass-through output and a second quadrant of the discrete sine waveform when addressed by the first inverted output;
a means for inverting the first and second quadrants of the discrete sine waveform to generate a third and fourth quadrants of the discrete sine waveform;
a second ones complementor coupled to the discrete noise shaper output, configured to sequentially generate a second pass-through output and a second inverted output;
a second read only memory (ROM) coupled to the second ones complementor, and configured to generate a first quadrant of the discrete cosine waveform when addressed by the second pass-through output and a second quadrant of the discrete cosine waveform when addressed by the second inverted output; and
a means for inverting the first and second quadrants of the discrete cosine waveform to generate a third and fourth quadrant of the discrete cosine waveform.

16. The hybrid frequency synthesizer of claim 15, wherein:
the means for inverting the first and second quadrants of the discrete sine waveform comprises a most significant bit (MSB) from the discrete noise shaper output appended to the discrete sine waveform, whereby the MSB acts as a sign bit for the discrete sine waveform; and
the means for inverting the first and second quadrants of the discrete cosine waveform comprises the most significant bit (MSB) from the discrete noise shaper output appended to the discrete cosine waveform, whereby the MSB acts as the sign bit for the discrete cosine waveform.

17. The hybrid frequency synthesizer of claim 15, wherein the first and second ones complementors are controlled by a second most significant bit (MSB-1) from the discrete noise shaper output.

18. The hybrid frequency synthesizer of claim 15, wherein the first and second ROMs are $2^5 \times 16$ bit ROMs.

19. The hybrid frequency synthesizer of claim 13, wherein the phase-to-amplitude translator comprises:
a read only memory (ROM) that generates a first quadrant of the discrete sine waveform and a first quadrant of the discrete cosine waveform;

a means for reversing the order of the first quadrant of the discrete sine and cosine waveforms, producing a second quadrant of the discrete sine and cosine waveforms; and
a means for inverting the first and second quadrants of the discrete sine and cosine waveforms, producing a third and fourth quadrant of the sine and cosine waveforms.

20. The hybrid frequency synthesizer of claim 9, wherein the means for inverting the first and second quadrants of the discrete waveform comprises a most significant bit (MSB) from the discrete noise shaper output appended to the discrete waveform, whereby the MSB acts as a sign bit for the discrete waveform.

21. The hybrid frequency synthesizer of claim 9, wherein the ones complementor is controlled by a second most significant bit (MSB-1) from the discrete noise shaper output.

22. The hybrid frequency synthesizer of claim 9, wherein the ROM is a $2^5 \times 16$ bit ROM.

23. A hybrid frequency synthesizer, comprising:
a reference source configured to generate a reference frequency signal;
a phase accumulator configured to generate a discrete phase signal;
a noise shaper that reduces spurious phase modulation in the discrete phase signal, and which generates a discrete noise shaper output;
a phase-to-amplitude translator addressed by the discrete noise shaper output that generates a discrete sine waveform and a discrete cosine waveform;
a digital image reject mixer coupled to the phase-to-amplitude translator and the reference source, and configured to combine the reference frequency signal and the discrete sine and cosine waveforms to generate a mixer output signal having a most significant bit (MSB); and
a phase locked loop frequency synthesizer (PLL) having an input which is coupled to the MSB of the mixer output signal, and which is configured to generate a frequency synthesizer output that is a multiple of the mixer output signal.

24. The hybrid frequency synthesizer of claim 23, wherein the phase accumulator includes a frequency control word input that modulates the discrete phase signal.

25. The hybrid frequency synthesizer of claim 23, wherein the reference frequency signal is also a clock input to the phase accumulator.

26. The hybrid frequency synthesizer of claim 23, wherein the reference source is a crystal oscillator.

27. The hybrid frequency synthesizer of claim 26, wherein the reference source is a temperature controlled crystal oscillator.

28. The hybrid frequency synthesizer of claim 23, wherein the PLL comprises:
a feedback loop system including a divider;
a phase detector configured to compare the mixer output signal and a feedback signal from the feedback loop system, and to generate an error signal as a function of a phase difference between the mixer output signal and the feedback signal;
a charge pump coupled to the phase detector that generates a current pulse having a polarity that is determined by the error signal;
a loop filter coupled to the charge pump that converts the current pulse into a DC voltage; and a voltage controlled oscillator coupled to the loop filter and the feedback loop system for generating the frequency synthesizer output as a function of the DC voltage.

29. The hybrid frequency synthesizer of claim 23, wherein the noise shaper is a first order noise shaper.

30. The hybrid frequency synthesizer of claim 23, wherein the noise shaper is a second order noise shaper.

31. The hybrid frequency synthesizer of claim 23, further comprising:
    a first half-band filter coupled between the phase-to-amplitude translator and the digital image reject mixer for reducing noise in the discrete sine waveform; and
    a second half-band filter coupled between the phase-to-amplitude translator and the digital image reject mixer for reducing noise in the discrete cosine waveform.

32. The hybrid frequency synthesizer of claim 23, wherein the phase-to-amplitude translator comprises a read only memory (ROM).

33. The hybrid frequency synthesizer of claim 23, wherein the phase-to-amplitude translator comprises:
    a first ones complementor coupled to the discrete noise shaper output that sequentially generates a first pass-through output and a first inverted output;
    a first ROM coupled to the first ones complementor that generates a first quad rant of the discrete sine waveform when addressed by the first pass-through output and a second quadrant of the discrete sine waveform when addressed by the first inverted output;
    a means for inverting the first and second quadrants of the discrete sine waveform to generate a third and fourth quadrant of the discrete sine waveform;
    a second ones complementor coupled to the discrete noise shaper output that sequentially generates a second pass-through output and a second inverted output;
    a second ROM coupled to the second ones complementor that generates a first quadrant of the discrete cosine waveform when addressed by the second pass-through output and a second quadrant of the discrete cosine waveform when addressed by the second inverted output; and
    a means for inverting the first and second quadrants of the discrete cosine waveform to generate a third and fourth quadrant of the discrete cosine waveform.

34. The hybrid frequency synthesizer of claim 33, wherein
    the means for inverting the first and second quadrants of the discrete sine waveform comprises a most significant bit (MSB) from the discrete noise shaper output appended to the discrete sine waveform, whereby the MSB acts as a sign bit for the discrete sine waveform; and
    the means for inverting the first and second 90° quadrants of the discrete cosine waveform comprises the most significant bit (MSB) from the discrete noise shaper output appended to the discrete cosine waveform, whereby the MSB acts as the sign bit for the discrete cosine waveform.

35. The hybrid frequency synthesizer of claim 33, wherein the first and second ones complementors are controlled by a second most significant bit (MSB−1) from the discrete noise shaper output.

36. The hybrid frequency synthesizer of claim 33, wherein the first and second ROMs are $2^5 \times 16$ bit ROMs.

37. The hybrid frequency synthesizer of claim 23, wherein the phase-to-amplitude translator comprises:

a read only memory (ROM) that generates a first quadrant of the discrete sine waveform and a first quadrant of the discrete cosine waveform;
    a means for reversing the order of the first quadrant of the discrete sine and cosine waveforms, producing a second quadrant of the discrete sine and cosine waveforms; and
    a means for inverting the first and second quadrants of the discrete sine and cosine waveforms, producing a third and fourth quadrant of the sine and cosine waveforms.

38. The hybrid frequency synthesizer of claim 23, wherein the digital image reject mixer comprises:
    a divider coupled to the reference source that generates a 0° phased clock signal and a 90° phased clock signal;
    a first ones complementor coupled to the discrete sine waveform that generates an inverted discrete sine waveform;
    a first multiplexer having a first state and a second state controlled by the 0° phased clock signal, which multiplies the 0° phased clock signal with the discrete sine waveform to generate a first multiplexer output when in the first state, and multiplies the 0° phased clock signal with the inverted discrete sine waveform to generate the first multiplexer output when in the second state;
    a second ones complementor coupled to the discrete cosine waveform that generates an inverted discrete cosine waveform;
    a second multiplexer having a first state and a second state, which multiplies the 90° phased clock signal with the discrete cosine waveform to generate a second multiplexer output when in the first state, and multiplies the 90° phased clock signal with the inverted discrete cosine waveform to generate the second multiplexer output when in the second state; and
    an adder that sums the first multiplexer output and the second multiplexer output to generate the mixer output signal.

39. A hybrid frequency synthesizer, comprising:
    a reference source configured to generate a reference frequency signal;
    a phase accumulator configured to generate a discrete phase signal;
    a noise shaper that reduces spurious phase modulation in the discrete phase signal and which generates a discrete noise shaper output;
    a phase-to-amplitude translator addressed by the discrete noise shaper output that generates a discrete sine waveform and a discrete cosine waveform;
    a digital image reject mixer coupled to phase-to-amplitude translator and the reference source, and configured to combine the reference frequency signal and the discrete sine and cosine waveforms to generate a mixer output signal;
    a band pass sigma delta modulator coupled to the image reject mixer that converts the mixer output signal into a modulated one bit signal; and
    a phase locked loop frequency synthesizer (PLL) having an input coupled to the modulated one bit signal, and configured to generate a frequency synthesizer output that is a multiple of the modulated one bit signal.

40. The hybrid frequency synthesizer of claim 39, wherein the phase accumulator includes a frequency control word input that modulates the discrete phase signal.

41. The hybrid frequency synthesizer of claim 39, wherein the reference frequency signal is also a clock input to the phase accumulator.

42. The hybrid frequency synthesizer of claim 39, wherein the reference source is a crystal oscillator.

43. The hybrid frequency synthesizer of claim 42, wherein the reference source is a temperature controlled crystal oscillator.

44. The hybrid frequency synthesizer of claim 39, wherein the PLL comprises:
- a feedback loop system including a divider;
- a phase detector configured to compare the mixer output signal and a feedback signal from the feedback loop system, and to generate an error signal as a function of a phase difference between the mixer output signal and the feedback signal;
- a charge pump coupled to the phase detector that generates a current pulse having a polarity that is determined by the error signal;
- a loop filter coupled to the charge pump that converts the current pulse into a DC voltage; and
- a voltage controlled oscillator coupled to the loop filter and the feedback loop system for generating the frequency synthesizer output as a function of the DC voltage.

45. The hybrid frequency synthesizer of claim 39, wherein the noise shaper is a first order noise shaper.

46. The hybrid frequency synthesizer of claim 39, wherein the noise shaper is a second order noise shaper.

47. The hybrid frequency synthesizer of claim 39, further comprising:
- a first half-band filter coupled between the phase-to-amplitude translator and the digital image reject mixer, and configured to reduce noise in the discrete sine waveform; and
- a second half-band filter coupled between the phase-to-amplitude translator and the digital image reject mixer, and configured to reduce noise in the discrete cosine waveform.

48. The hybrid frequency synthesizer of claim 39, wherein the phase-to-amplitude translator comprises a read only memory (ROM).

49. The hybrid frequency synthesizer of claim 39, wherein the phase-to-amplitude translator comprises:
- a first ones complementor coupled to the discrete noise shaper output, and configured to sequentially generate a first pass-through output and a first inverted output;
- a first ROM coupled to the first ones complementor, and configured to generate a first quadrant of the discrete sine waveform when addressed by the first pass-through output and a second quadrant of the discrete sine waveform when addressed by the first inverted output;
- a means for inverting the first and second quadrants of the discrete sine waveform to generate a third and fourth quadrant of the discrete sine waveform;
- a second ones complementor coupled to the discrete noise shaper output, and configured to sequentially generate a second pass-through output and a second inverted output;
- a second ROM coupled to the second ones complementor, and configured to generate a first quadrant of the discrete cosine waveform when addressed by the second pass-through output and a second quadrant of the discrete cosine waveform when addressed by the second inverted output; and
- a means for inverting the first and second quadrants of the discrete cosine waveform to generate a third and fourth quadrant of the discrete cosine waveform.

50. The hybrid frequency synthesizer of claim 49, wherein
- the means for inverting the first and second quadrants of the discrete sine waveform comprises a most significant bit (MSB) from the discrete noise shaper output appended to the discrete sine waveform, whereby the MSB acts as a sign bit for the discrete sine waveform; and
- the means for inverting the first and second quadrants of the discrete cosine waveform comprises the most significant bit (MSB) from the discrete noise shaper output appended to the discrete cosine waveform, whereby the MSB acts as the sign bit for the discrete cosine waveform.

51. The hybrid frequency synthesizer of claim 49, wherein the first and second ones complementors are controlled by a second most significant bit (MSB−1) from the discrete noise shaper output.

52. The hybrid frequency synthesizer of claim 49, wherein the first and second ROMs are $2^5 \times 16$ bit ROMs.

53. The hybrid frequency synthesizer of claim 39, wherein the phase-to-amplitude translator comprises:
- a read only memory (ROM) that generates a first quadrant of the discrete sine waveform and a first quadrant of the discrete cosine waveform;
- a means for reversing the order of the first quadrant of the discrete sine and cosine waveforms, producing a second quadrant of the discrete sine and cosine waveforms; and
- a means for inverting the first and second quadrants of the discrete sine and cosine waveforms, producing a third and fourth quadrant of the sine and cosine waveforms.

54. The hybrid frequency synthesizer of claim 39, wherein the digital image reject mixer comprises:
- a divider coupled to the reference source that generates a 0° phased clock signal and a 90° phased clock signal;
- a first ones complementor coupled to the discrete sine waveform that generates an inverted discrete sine waveform;
- a first multiplexer having a first state and a second state controlled by the 0° phased clock signal, which multiplies the 0° phased clock signal with the discrete sine waveform to generate a first multiplexer output when in the first state, and multiplies the 0° phased clock signal with the inverted discrete sine waveform to generate the first multiplexer output when in the second state;
- a second ones complementor coupled to the discrete cosine waveform that generates an inverted discrete cosine waveform;
- a second multiplexer having a first state and a second state, which multiplies the 90° phased clock signal with the discrete cosine waveform to generate a second multiplexer output when in the first state, and multiplies the 90° phased clock signal with the inverted discrete cosine waveform to generate the second multiplexer output when in the second state; and
- an adder that sums the first multiplexer output and the second multiplexer output to generate the mixer output signal.

55. The hybrid frequency synthesizer of claim 39, further comprising:
- an analog filter coupled between the band pass sigma delta modulator and the PLL that removes spurious signals from the modulated one bit signal.

56. A direct digital frequency synthesizer, comprising:

a phase accumulator configured to generate a discrete phase signal;

a noise shaper that reduces spurious phase modulation in the discrete phase signal, and which generates a discrete noise shaper output;

a phase-to-amplitude translator addressed by the discrete noise shaper output that generates a discrete waveform;

a digital to analog converter (DAC) coupled to the phase-to-amplitude translator that converts the discrete waveform to a continuous waveform; and a reference source coupled to a clock input of the phase accumulator.

57. The direct digital frequency synthesizer of claim 56, further comprising:

a reference source coupled to a clock input of the phase accumulator.

58. The direct digital frequency synthesizer of claim 56, wherein the reference source is a crystal oscillator.

59. The direct digital frequency synthesizer of claim 58, wherein the reference source is a temperature controlled crystal oscillator.

60. The direct digital frequency synthesizer of claim 56, wherein the noise shaper is a first order noise shaper.

61. The direct digital frequency synthesizer of claim 56, wherein the noise shaper is a second order noise shaper.

62. The direct digital frequency synthesizer of claim 56, further comprising:

a half-band filter coupled between the phase-to-amplitude translator and the DAC that reduces noise in the discrete waveform.

63. The direct digital frequency synthesizer of claim 56, wherein the phase-to-amplitude translator comprises a read only memory (ROM).

64. The direct digital frequency synthesizer of claim 56, wherein the phase-to-amplitude translator comprises:

a ones complementor coupled to the discrete noise shaper output, and configured to sequentially generate a pass-through output and an inverted output;

a ROM coupled to the ones complementor, and configured to generate a first quadrant of the discrete waveform when addressed by the pass-through output and a second quadrant of the discrete waveform when addressed by the inverted output; and means for inverting the first and second quadrants of the discrete waveform to generate a third and fourth quadrant of the discrete waveform.

65. The direct digital frequency synthesizer of claim 64, wherein the means for inverting the first and second quadrants of the discrete waveform comprises a most significant bit (MSB) from the discrete noise shaper output appended to the discrete waveform, whereby the MSB acts as a sign bit for the discrete waveform.

66. The direct digital frequency synthesizer of claim 64, wherein the ones complementor is controlled by a second most significant bit (MSB−1) from the discrete noise shaper output.

67. The direct digital frequency synthesizer of claim 64, wherein the ROM is a $2^5 \times 16$ bit ROM.

68. The direct digital frequency synthesizer of claim 56, further comprising:

a low pass filter coupled to the DAC that smoothes the continuous waveform.

* * * * *